United States Patent
Lai

(10) Patent No.: US 12,351,751 B2
(45) Date of Patent: Jul. 8, 2025

(54) LIGHT EMISSION MATERIAL AND APPLICATIONS THEREOF

(71) Applicant: Feng Chia University, Taichung (TW)

(72) Inventor: Chun-Feng Lai, Taichung (TW)

(73) Assignee: Feng Chia University, Taichung (TW)

( * ) Notice: Subject to any disclaimer, the term of this patent is extended or adjusted under 35 U.S.C. 154(b) by 472 days.

(21) Appl. No.: 17/994,824

(22) Filed: Nov. 28, 2022

(65) Prior Publication Data
US 2023/0323202 A1  Oct. 12, 2023

(30) Foreign Application Priority Data
Apr. 8, 2022  (TW) .................. 111113503

(51) Int. Cl.
*C09K 11/88* (2006.01)
*B82Y 20/00* (2011.01)
(Continued)

(52) U.S. Cl.
CPC .......... *C09K 11/883* (2013.01); *C09K 11/025* (2013.01); *C09K 11/0883* (2013.01);
(Continued)

(58) Field of Classification Search
CPC .............................. C09K 11/883; H10H 20/811
See application file for complete search history.

(56) References Cited

U.S. PATENT DOCUMENTS

2013/0115455 A1* 5/2013 Banin .................. C09K 11/883
977/773

2019/0273178 A1* 9/2019 Jen-La Plante ........ H10H 20/01
(Continued)

FOREIGN PATENT DOCUMENTS

CN          111394091 A          7/2020

OTHER PUBLICATIONS

Allison M. Dennis et. al., Role of Interface Chemistry in Opening New Radiative Pathways in InP/CdSe Giant Quantum Dots with Blinking-Suppressed Two-Color Emission, Advanced Functional Materials, 2019, vol. 29, issue 37, WILEY-VCH Verlag Gmbh & Co. KGaA, Weinheim.

*Primary Examiner* — Evren Seven
(74) *Attorney, Agent, or Firm* — Best & Flanagan LLP

(57) ABSTRACT

The present invention is related to a light emission or a luminescent material and applications thereof. The said material comprises a spherical core, a spherical shell deposited at outer surface of the spherical core, and further a rod shell deposited at outer surface of the spherical shell. The said spherical core comprises Indium phosphide particle with substantially spherical appearance or condition. The said spherical shell comprises Cadmium selenium deposited at outer surface of the spherical core with corresponded spherical appearance or condition. The rod shell comprises cadmium sulfide deposited at outer surface of the spherical shell with its structure extended in lengthwise longer than crosswise to a rod appearance or condition. The luminescent material provided by the present invention has a Type II NCs structure using cadmium selenium as the spherical shell to emit near-infrared light. The present invention provides InP/CdS/CeSe in core/shell/shell structure as luminescent material which has extra-broadband VIS-NIR emitting abilities.

10 Claims, 20 Drawing Sheets

(51) Int. Cl.
*B82Y 40/00* (2011.01)
*C09K 11/02* (2006.01)
*C09K 11/08* (2006.01)
*H10H 20/851* (2025.01)

(52) U.S. Cl.
CPC .......... *H10H 20/8512* (2025.01); *B82Y 20/00* (2013.01); *B82Y 40/00* (2013.01)

(56) References Cited

U.S. PATENT DOCUMENTS

2022/0267672 A1* 8/2022 Yeh ...................... C09K 11/883
2024/0376375 A1* 11/2024 Kossoy .................. H10K 59/38

* cited by examiner

LIGHT EMISSION MATERIAL AND APPLICATIONS THEREOF

CLAIM OF PRIORITY

This application claims the benefit of TW invention patent application No. 111113503 filed on Apr. 8, 2022, the entire contents of which is incorporated herein by reference.

FIELD OF INVENTION

The present invention is a light emission or a luminescent material, especially a luminescent material with ultra-broadband VIS-NIR emitting abilities.

BACKGROUND OF THE INVENTION

Near-Infrared (NIR) is a light source with a wavelength between 780 nm and 1400 nm. This light source has the advantages of non-destructive ability but still with certain penetrating power making it became quite suitable for applying on instant non-destructive testing such as food analysis, health monitoring, biomedical display, environmental detection, iris recognition and optical cameras with various fields and products.

NIR light-emitting semiconductors (or also called Light-emitting diodes, LEDs) are the applied technology which directly project the NIR rays emitted by the luminescent material to the aforementioned applications. However, the current mainstream epitaxial growth NIR LEDs in the market could only provide with less than 50 nm of the full width at half maxima (FWHM). Such extremely narrative width of FWHM is far not enough to cover full spectral of the testing subject as mentioned above which will cause low sensitivity and limit the flexibility for the applications.

Although there already are some LEDs providing full-spectrum or broadband on the market by mixing various colored phosphors. The strong reabsorption between different phosphors leads to large energy loss and reduces luminous efficiency still are some obstacles needed to be solved.

Hence, it is eager to have a solution for providing a light source with a broadband or even an ultra-broadband while still maintaining excellent luminous efficiency that will overcome or substantially ameliorate at least one or more of the deficiencies of a prior art, or to at least provide an alternative solution to the problems. It is to be understood that, if any prior art information is referred to herein, such reference does not constitute an admission that the information forms part of the common general knowledge in the art.

SUMMARY OF THE INVENTION

In order to solve the problems that the extremely narrative width of FWHM of the current NIR LEDs, and the strong reabsorption by mixing different phosphors with too much energy loss and the reduced luminous efficiency, the present invention is required. The present invention provides a luminescent material with ultra-broadband VIS-NIR emitting abilities comprising a spherical core; a first spherical shell deposited at a outer surface of the spherical core; a second rod-shaped shell deposited at a outer surface of the first spherical shell; wherein: the spherical core is an indium phosphide particle presenting as a spherical structure; the first spherical shell is cadmium selenide (CdSe) deposited or coated onto the outer surface of the spherical core; and the second rod-shaped shell is cadmium sulfide (CdS) deposited or coated onto the outer surface of the spherical shell.

In accordance, the present invention also provides a polarizer comprising the luminescent material as above and being aligned in order in to a membrane or a film.

In accordance, the present invention further provides a LEDs package structure having the luminescent material as mentioned above being blended with a polymer and packed into the semiconductor package with a chip. Such LEDs package structure could also uses the polarizer and be packed into the semiconductor package with a chip.

In accordance, the present invention has the following advantages:

1. The luminescent material provided by the present invention forms a Type II NCs structure by the first spherical shell using cadmium selenide which allows the luminescent material to be able to emit near-infrared luminescence. Further by forming rod-shaped outer shell by indium phosphide to obtain quantum rods structure (QRs), the present invention hence can generate ultra-broadband fluorescence from visible light to near-infrared (VIS-NIR). The present invention is able to improve the problems or disadvantages of the extremely narrow spectrum of the conventional NIR LEDs and full-spectrum LEDs by combining various color phosphors causing strong reabsorption and great energy loss with reduced luminous efficiency.
1. The luminescent material provided by the present invention forms a Type II NCs structure by the first spherical shell using cadmium selenide which allows the luminescent material to be able to emit near-infrared luminescence. Further by forming rod-shaped outer shell by indium phosphide to obtain quantum rods structure (QRs), the present invention hence can generate ultra-broadband fluorescence from visible light to near-infrared (VIS-NIR). The present invention is able to improve the problems or disadvantages of the extremely narrow spectrum of the conventional NIR LEDs and full-spectrum LEDs by combining various color phosphors causing strong reabsorption and great energy loss with reduced luminous efficiency.

Many of the attendant features and advantages of the present invention will become better understood with reference to the following detailed description considered in connection with the accompanying figures and drawings.

BRIEF DESCRIPTION OF THE DRAWINGS

The steps and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
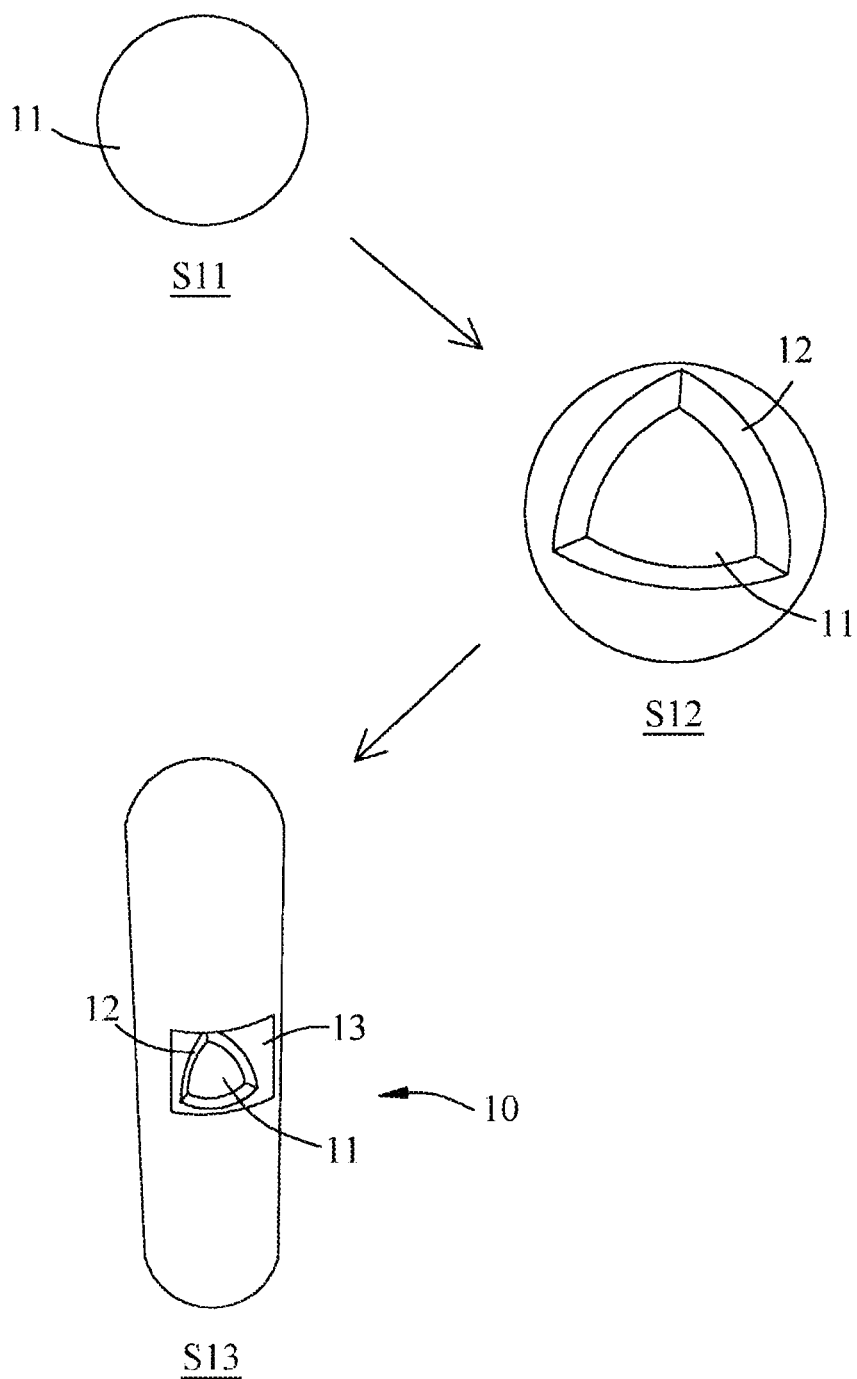
FIG. 1 is an illustrating layering flow chart of a first preferred embodiment of the luminescent material in accordance to the present invention.

Reference will now be made in detail to the present preferred embodiments of the invention, examples of which are illustrated in the accompanying drawings. Wherever possible, the same reference numbers are used in the drawings and the description to refer to the same or like parts. It is not intended to limit the method by the exemplary embodiments described herein. In the following detailed description, for purposes of explanation, numerous specific details are set forth in order to attain a thorough understanding of the disclosed embodiments. It will be apparent, however, that one or more embodiments may be practiced without these specific details. As used in the description herein and throughout the claims that follow, the meaning of "a", "an", and "the" may include reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to.

<A First Preferred Embodiment of the Luminescent Material InP/CdSe/CdS in A Spherical Core/spherical Shell/rod-Shaped Shell Arrangement>

With reference to FIG. 1, a first preferred embodiment of the luminescent material 10 of the present invention is a multiple core-shells structure comprising a spherical core 11, a first spherical shell 12 deposited at a outer surface of the spherical core 11, and a second rod-shaped shell 13 deposited at a outer surface of the first spherical shell 12. A preferred embodiment of the spherical core 11 is an indium phosphide (InP) particle. The spherical shell 12 is preferred to be cadmium selenide (CdSe) spherical core deposited or coated onto the outer surface of the spherical core 11. The rod-shaped shell 13 is preferred to be cadmium sulfide (CdS) rod-shaped shell deposited or coated onto the outer surface of the spherical shell 12. This embodiment provides the luminescent material 10 as InP/CdSe/CdS in a spherical core/spherical shell/rod-shaped shell arrangement. Such luminescent material 10 is also a type of Nanocrystals (NCs).

In details, the spherical core 11 of the present invention is in a solid or hollow spherical formation or substantially spherical formation like indium phosphide (InP) particles. The first spherical shell 12 of the present invention is preferred to be deposited or coated corresponded onto the surface of the spherical core 11. As shown in FIG. 1 the second rod-shaped shell 13 of the present invention is preferred to be extended in a longitude direction with a longer length and a shorter width. An average aspect ratio of the second rod-shaped shell 13 by its length and width is preferred at a range of 2~11 (under the condition that the length of the rod-shaped shell 13 is definitely greater or longer than the width of the rod-shaped shell 13). One preferred embodiment, the length of rod-shaped shell 13 is less than 50 nm and the width of the rod-shaped shell 13 is greater than 4 nm.

<A Preferred Embodiment for Producing the Luminescent Material of the First Embodiment>

To produce the luminescent material of the first embodiment, the steps comprise:

providing the spherical core 11 (or also particle);

S12) immersing the spherical core 11 into a first cadmium ion and selenium ion containing solution; the cadmium ion and selenium ion will be gradually attached or deposited onto the surface of the spherical core 11 to form the first spherical shell 12. This process which the ions gradually deposited or attached onto the surface could also call successive ionic layer adsorption and reaction (SILAR);

S13) immersing the first spherical shell 12 coated spherical core 11 into a second cadmium sulfide containing solution; the cadmium sulfide will be gradually attached or deposited onto the surface of the first spherical shell 12 to form the second rod-shaped shell 13 with extending in a longitude direction with a longer length and a shorter width. The average aspect ratio of the second rod-shaped shell 13 is adjustable in the present invention by variant immersing time and concentration of the ions deposition and attachment in the solutions.

<A Second Preferred Embodiment of the Luminescent Material—InP/CdSe/CdS/ZnS/SiO$_2$ in a Spherical Core/spherical Shell/rod-shaped Shell/rod-shaped Shell/rod-shaped Shell Arrangement>

Figure 2:
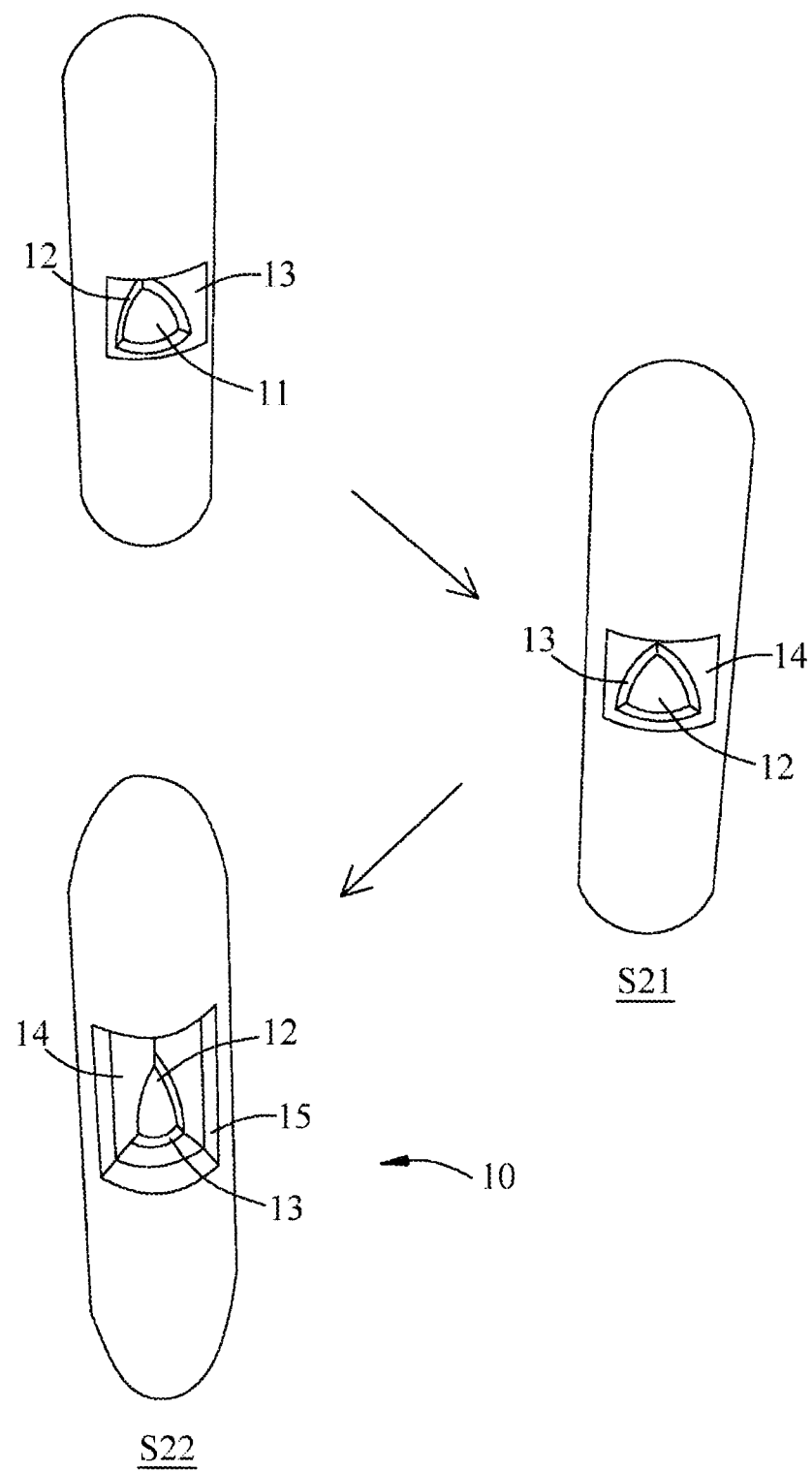
FIG. 2 is an illustrating layering flow chart of a second preferred embodiment of the luminescent material in accordance to the present invention.

With reference to FIG. 2, the second preferred embodiment of the present invention is to further included a third rod-shaped shell 14 and a fourth rod-shaped shell 15 onto a surface of the second rod-shaped shell 13.

The third rod-shaped shell 14 is preferred to be zinc sulfide (ZnS) and the fourth rod-shaped shell 15 is preferred to be silicon dioxide (SiO$_2$), silicon monoxide (SiO) or combination thereof. As shown in FIG. 2, the third rod-shaped shell 14 and the fourth rod-shaped of the present invention are preferred to be deposited or coated corresponded onto the surface of the second rod-shaped shell 12 in sequence so as to be also extended in a longitude direction with a longer length and a shorter width. An average aspect ratio of such shells by its length and width is preferred at a range of 2~11 (under the condition that the length of shell is definitely greater or longer than the width of the shell).

<A Preferred Embodiment for Producing the Luminescent Material of the Second Embodiment>

The first embodiment of the present invention (InP/CdSe/CdS) has an ultra-broadband VIS-NIR emitting ability. In order to improve the moisture, oxygen and heat resistance for the first embodiment (InP/CdSe/CdS) of the present invention, the third and fourth rod-shaped shells 14, 15 ($ZnS/SiO_2$) are further included as the second embodiment. Such approaches could prevent the crystal structure of the first embodiment being damaged by the moisture, oxygen and heat from the environment causing potential fluorescence quenching. The third and fourth rod-shaped shells 14, 15 could fill the surface defects of the second rod-shaped shell 13 to stabilize its nanocrystals (NCs) structure.

To produce the luminescent material of the second embodiment, the steps comprise:

S21) immersing the aforementioned first embodiment into a third zinc sulfide solution; the zinc sulfide will be gradually attached or deposited onto the surface of the second rod-shaped shell 13 to form the third rod-shaped shell 14;

S22) immersing the third rod-shaped shell 14 coated first embodiment into a fourth silicone containing solution; the silicone solution will be gradually attached or deposited onto the surface of the third rod-shaped shell 14 to form the fourth rod-shaped shell 15.

The fourth silicone containing solution as described in step S22 is preferred to contain a silicon compound, a cross-linking agent and an ammonia solution ($NH_4OH$). The silicon compound will be cross-linked into the fourth rod-shaped shell 15 by the cross-linking agent in the said fourth silicone containing solution.

The silicon compound in the present invention contains but limited to tetraethyl orthosilicate (TEOS), tetramethyl orthosilicate (MEOS), or 3-aminopropyltriethoxysilane (APTES). Specifically, TEOS is the preferred silicon compound among them. As for the cross-linking agent, it may be polyoxyethylene (5) nonylphenyl ether (i.e., Igepal CO-520) which is dissolved in cyclohexane or in hexane.

By using zinc sulfide as the third rod-shaped shell 14, such material could fill the surface defects of the second rod-shaped shell 13 of the first embodiment making a more density structure. The silicon dioxide is a transparent material which could be an ideally protective shell while maintaining and stabilizing an optical ability of NCs structure. The silicon dioxide could also solve the problem of originate high surface activity of NCs and prevent exchanging of surface anions and water/moisture damage to the NCs.

<A First Preferred Application of the Luminescent Material—Polarizer>

The first and second embodiments of the luminescent material in the present invention could be applied to produce high quality of polarizer. To create polarization to the first and second embodiments of the luminescent material, the luminescent material provided by the present invention is blended or mixed into a polymer (any suitable polymer for making membrane or film product) and spread into a membrane or a film by a scraper to make the rod-shaped luminescent material uniformly into alignment sequence or in order within the membrane or the film. The aligned luminescent material of the luminescent material could have polarization ability.

<A Second Preferred Application of the Luminescent Material—Semiconductor Package Structure Type I>

Figure 3:
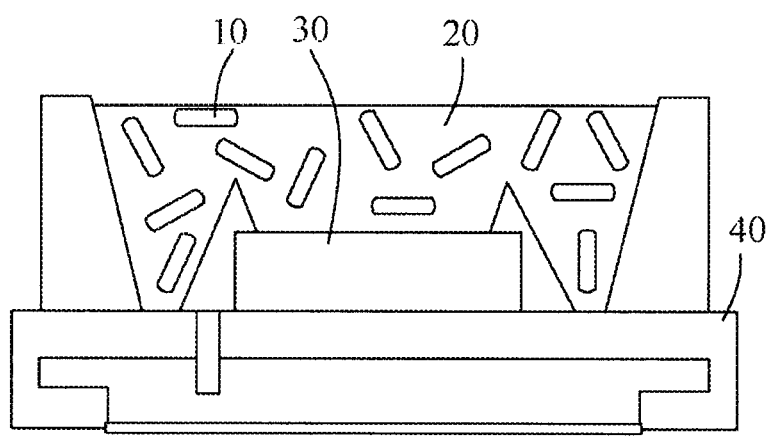
FIG. 3 is an illustrating figure of the first or second preferred embodiment of the luminescent material applied to a first type LEDs semiconductor package structure in accordance to the present invention.

With reference to FIG. 3, the present invention also applies the luminescent material to a first type of semiconductor package structure. By blending or mixing the luminescent material of the first or second embodiment as mentioned above into a silicone polymer 20, such mixture is packaged with a chip 30 into a semiconductor package 40. The semiconductor package 40 of the present invention is included but not limited to any commercial semiconductor packages such as PLCC, Conformal, Remote or CSP.

<A Third Preferred Application of the Luminescent Material—Semiconductor Package Structure Type II>

Figure 4:
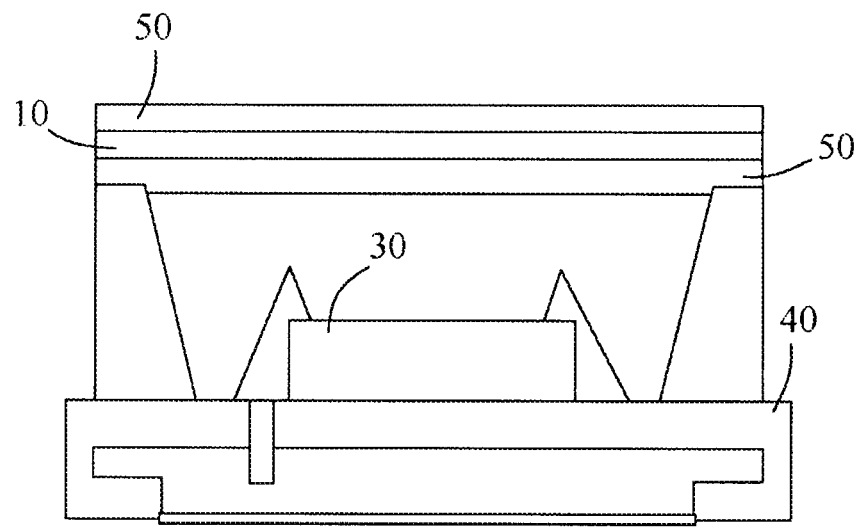
FIG. 4 is an illustrating figure of the first or second preferred embodiment of the luminescent material applied to a second type LEDs semiconductor package structure in accordance to the present invention.

With reference to FIG. 4, in this third preferred application or semiconductor package structure type II, the polarizer film is used to such package structure. The polarizer film is deposited on such semiconductor package with or without a barrier layer 50 to form this type II semiconductor package. Also, semiconductor package 40 of the present invention is included but not limited to any commercial semiconductor packages such as PLCC, Conformal, Remote or CSP.

<Validation Tests>

Figure 5:
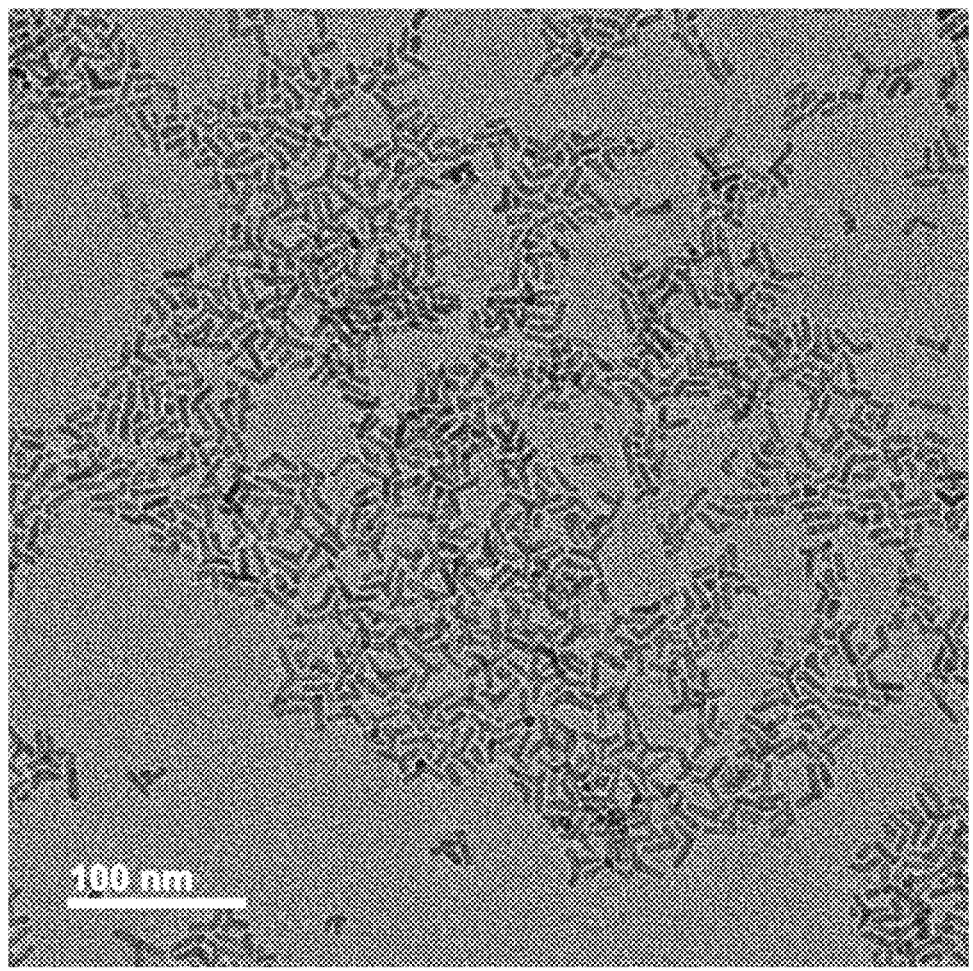
FIG. 5 and FIG. 6 are transmission electron microscope (TEM) images of the luminescent material of the first embodiment in accordance to the present invention.
Figure 6:
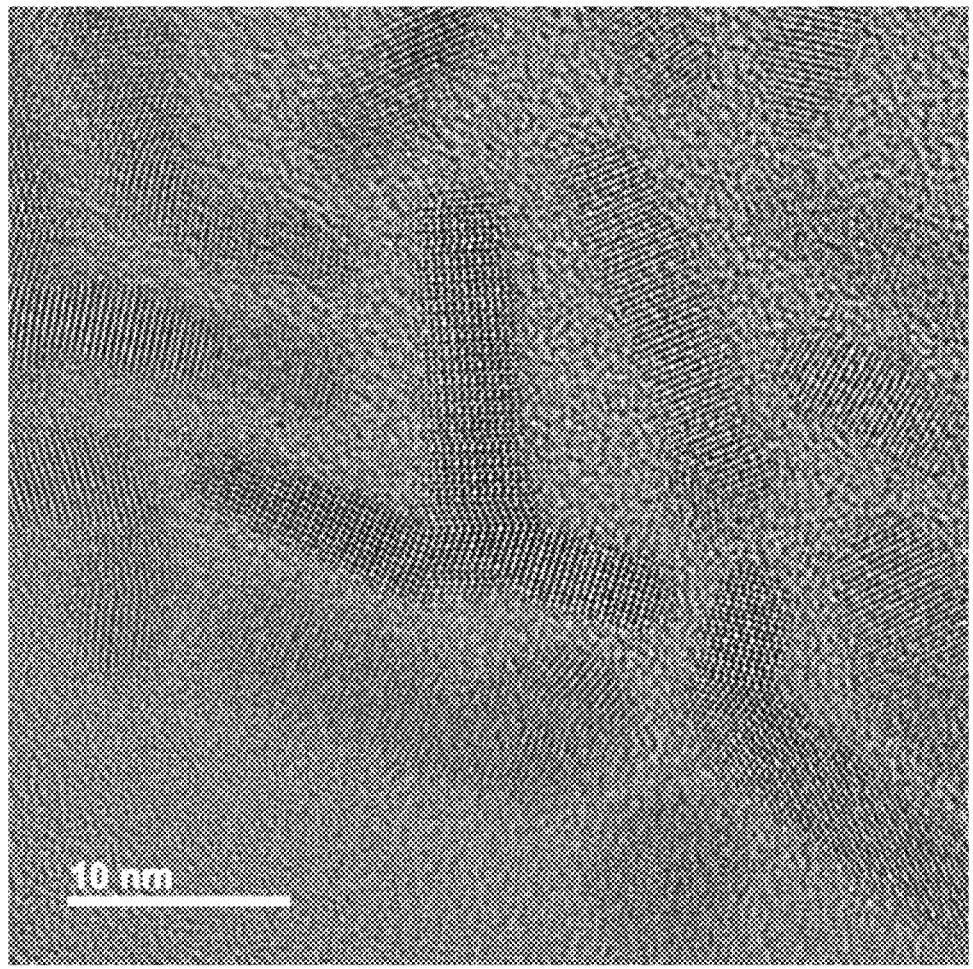
Figure 7:
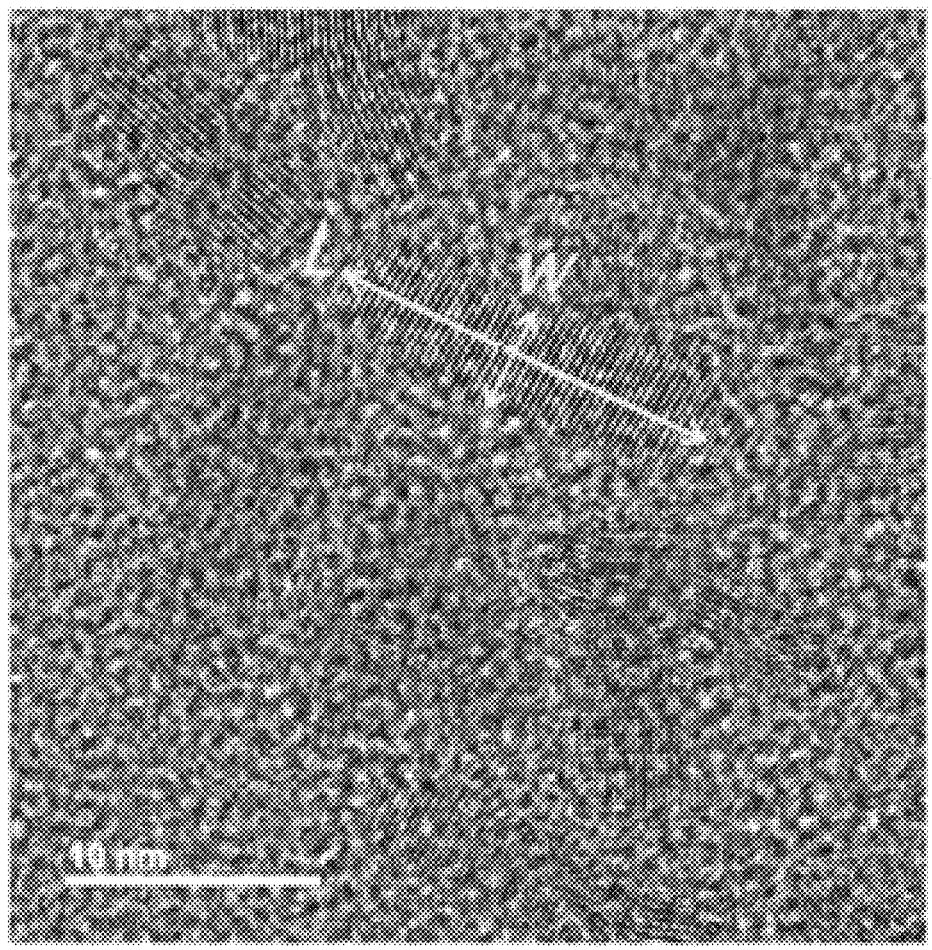
FIG. 7, FIG. 8A and FIG. 8B are transmission electron microscope (TEM) images of the luminescent material in the first and second embodiment in accordance to the present invention.
Figure 8A:
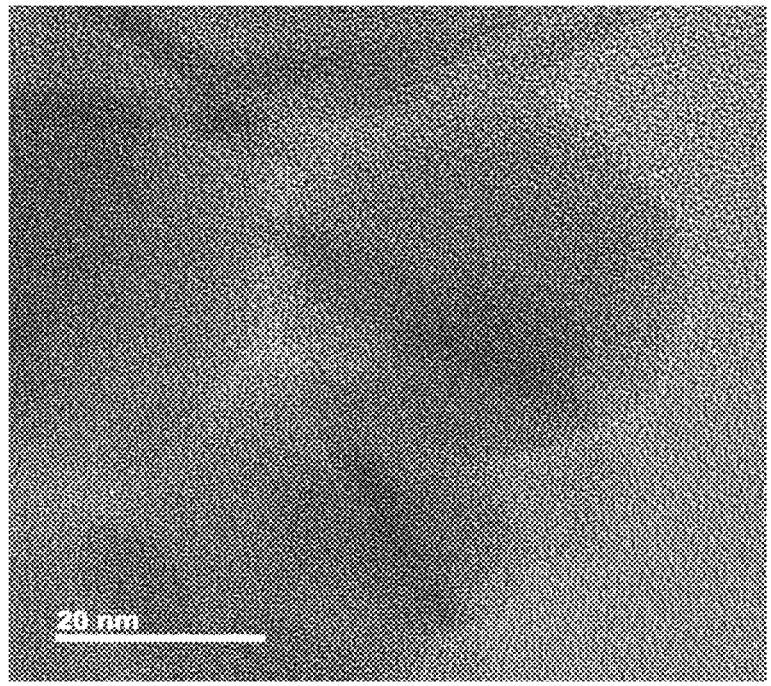
Figure 8B:
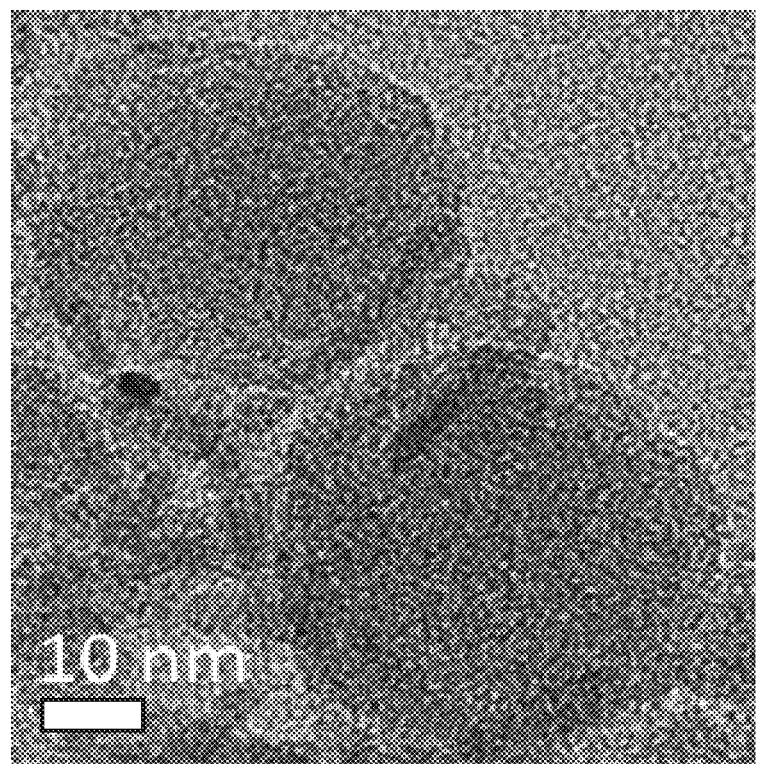

With reference to FIG. 5 and FIG. 6, transmission electron microscope (TEM) images of the luminescent material in the first embodiment are presented. FIG. 7. FIG. 8A and FIG. 8B are transmission electron microscope (TEM) images of the luminescent material in the first and the second embodiment. As shown in the figures, the luminescent material does presented the InP/CdSe/CdS as spherical (or particle) core/rod-shaped shell/rod-shaped shell in sequence and also InP/CdSe/CdS/ZnS@$SiO_2$ as core/rod-shaped shell/rod-shaped shell/rod-shaped shell/rod-shaped shell in sequence. The appearance and size of each luminescent material is in rod-shaped and unified in size. In these figures, the average aspect ratio of this embodiment is 3.9 with length in longitude of 17 nm and width in attitude of 4.3 nm. Under high-resolution analysis, it is clear that the luminescent material presented in lattice fringes indicating great crystallization with 3.7 Å of the interplanar spacing. FIG. 8A and FIG. 8B also show that the InP/CdSe/CdS rod-shaped inner core being coated by the $SiO_2$ coating.

Figure 9:
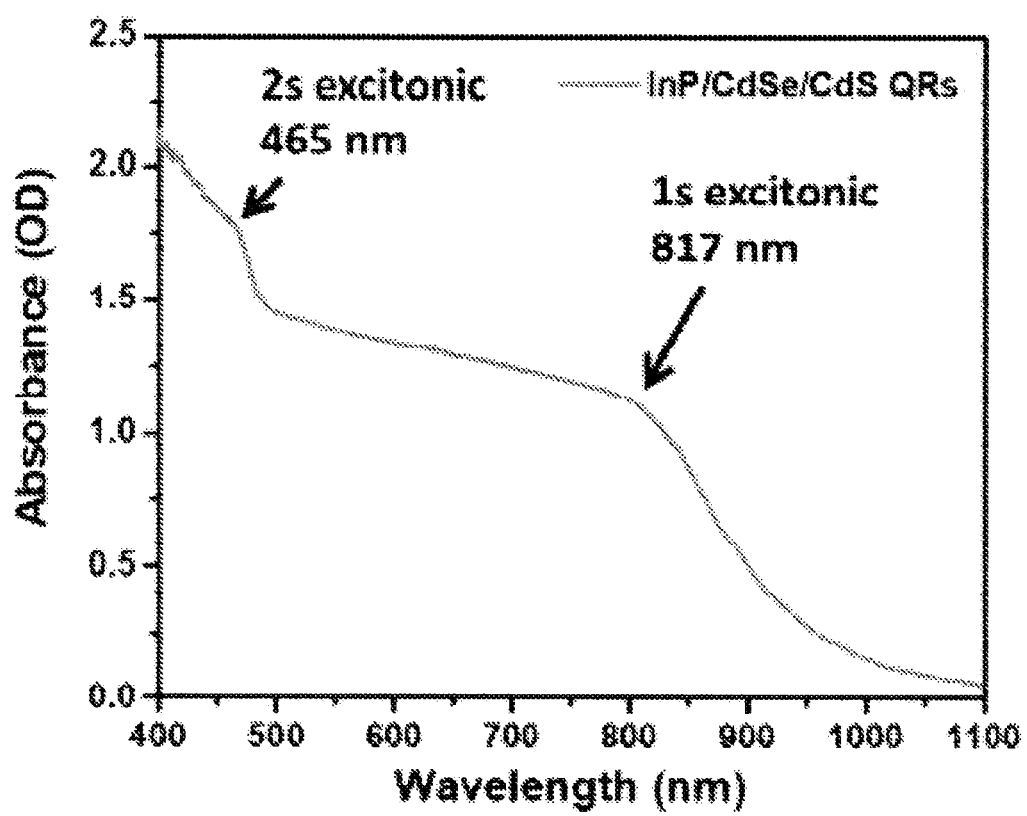
FIG. 9 is a spectroscopy image of the luminescent material of the first embodiment in accordance to the present invention.
Figure 10:
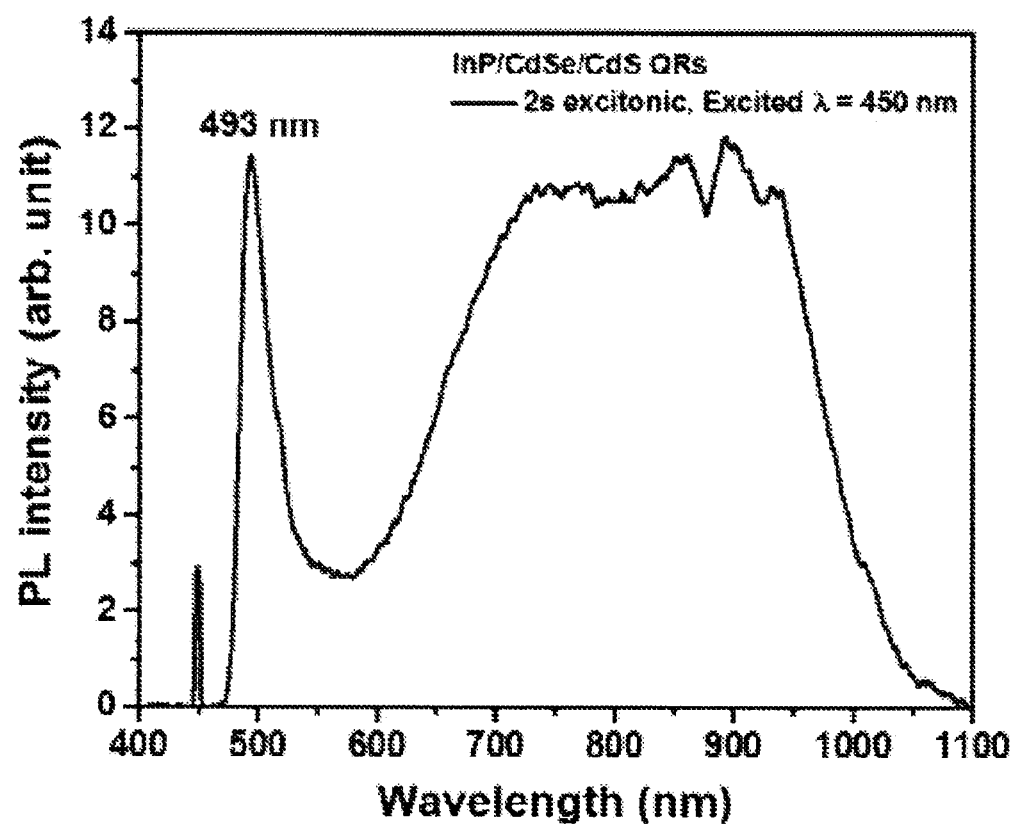
FIG. 10 and FIG. 11 are two fluorescence spectra images of the first embodiment of the luminescent material excited by different excitons respectively in accordance with the present invention.
Figure 11:
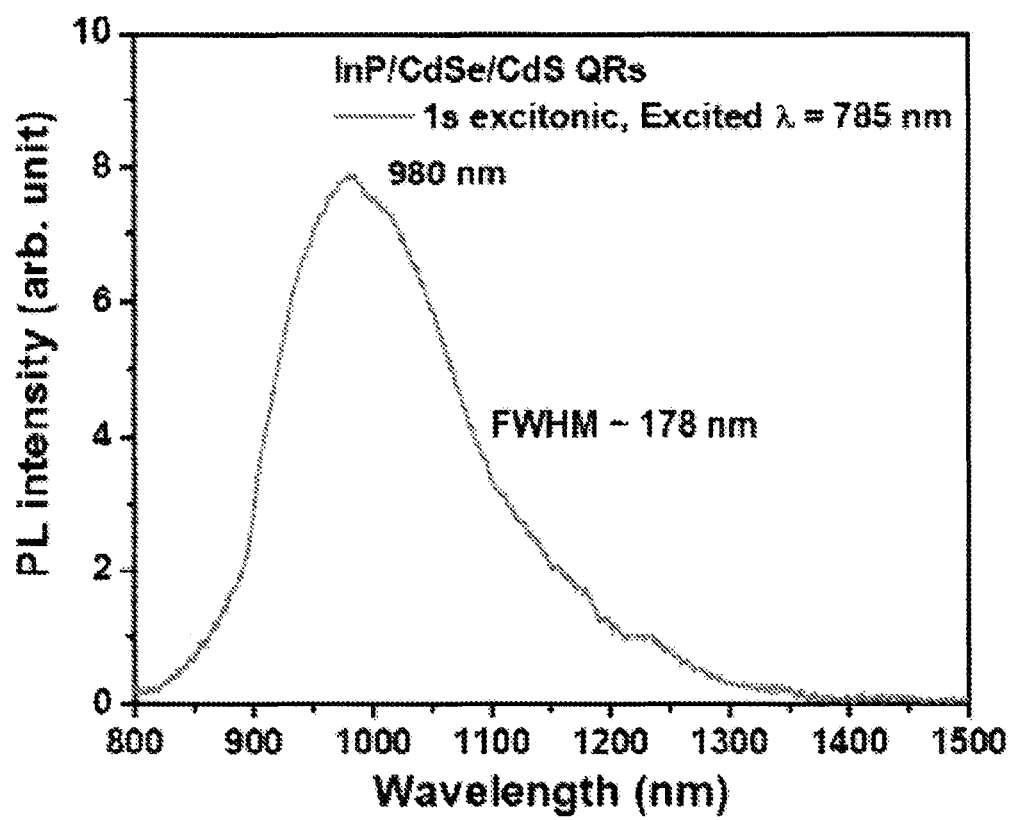

With reference to FIG. 9, a spectroscopy image of the luminescent material in the first embodiment is presented. The figure shows that the luminescent material of the present invention has two excitonic emission bands. The first excitonic emission band is at a wavelength of 817 nm and the second excitonic emission band is at a wavelength of 465 nm. The present invention further excites the luminescent material by using 450 nm and 785 nm two different light sources with the results showing in FIG. 10 and FIG. 11. In FIG. 10, by using the 450 nm wavelength exciting to light source, the luminescent material of the present invention is proved to have ultra-broadband emission from 470 nm to 1000 nm. In FIG. 11, by using 785 nm wavelength exciting light source, the luminescent material of the present invention is proved to have 980 nm fluorescence and FWHM close to 178 nm and also have ultra-broadband emission from 800 nm to 1400 nm. Commonly commercial used GaN-based LEDs provides luminescence spectral of 450 nm indicating the luminescent material of the present invention could be excited by the commercial used LEDs or even blue lasers and emitted ultra-broadband fluorescence.

In the meanwhile, another commonly commercial used AlGaAs-Based LEDs or related lasers provides luminescence spectral at a range of 780 to 820 nm indicating the luminescent material of the present invention could be excited by the commercial used LEDs or even lasers and emitted ultra-broadband fluorescence.

Figure 12:
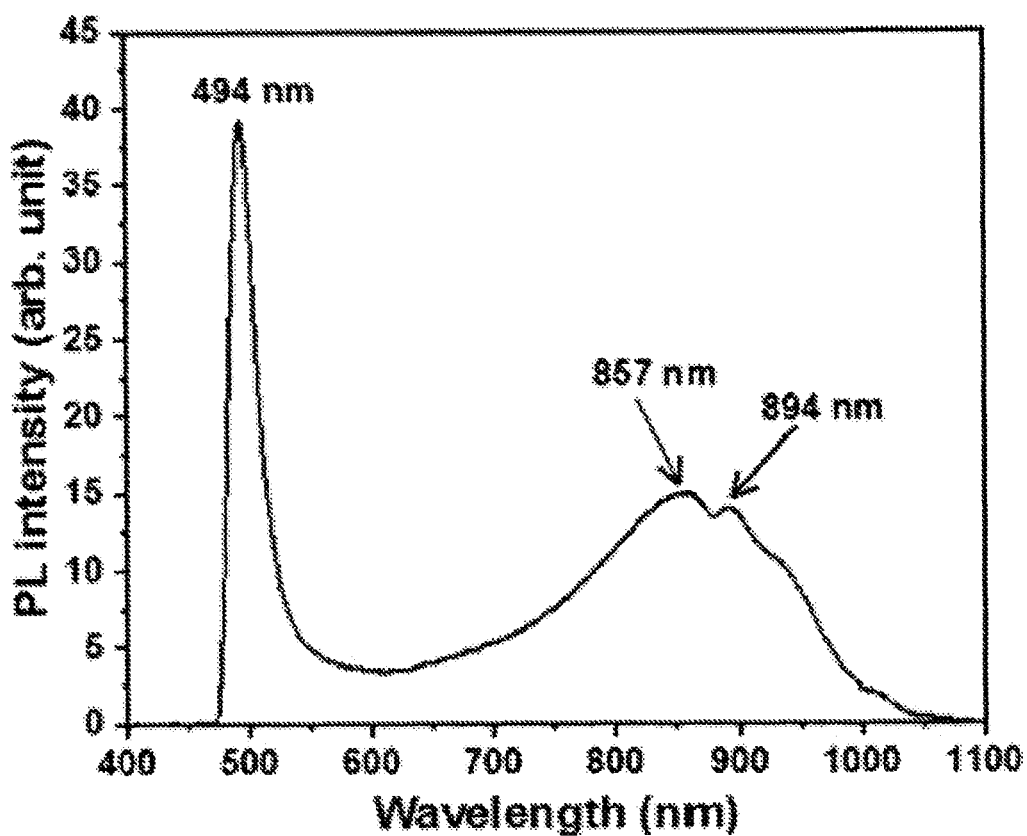
FIG. 12 and FIG. 13 are two fluorescence spectra images of the second embodiment of the luminescent material excited by different excitons respectively in accordance with the present invention.
Figure 13:
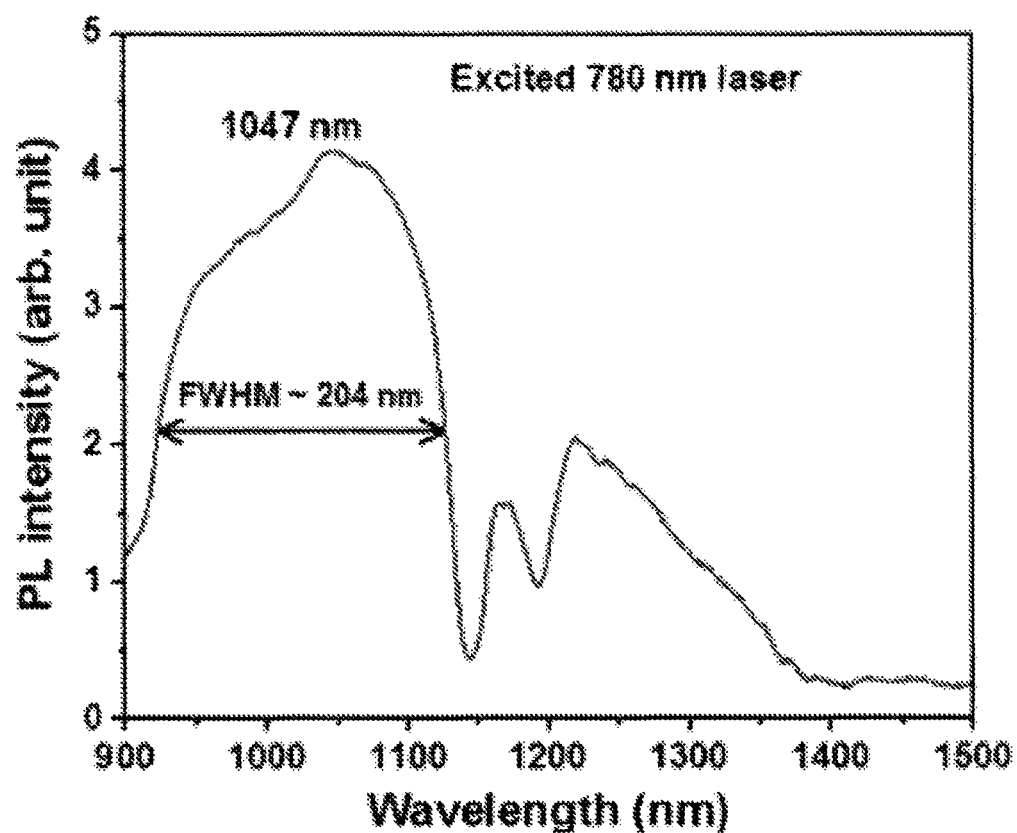
Figure 14:
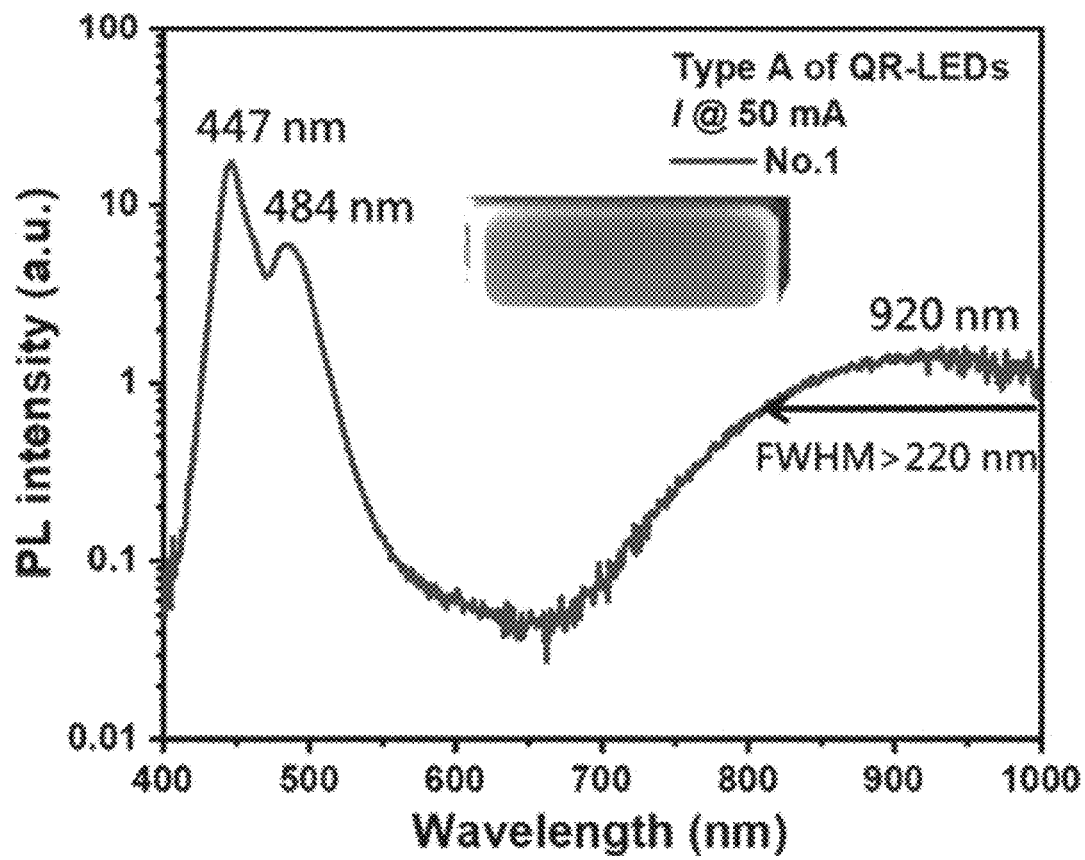
FIG. 14 to FIG. 17 are several spectroscopy images of types A to D semiconductor package structure of the second preferred application in accordance with the present invention.
Figure 15:
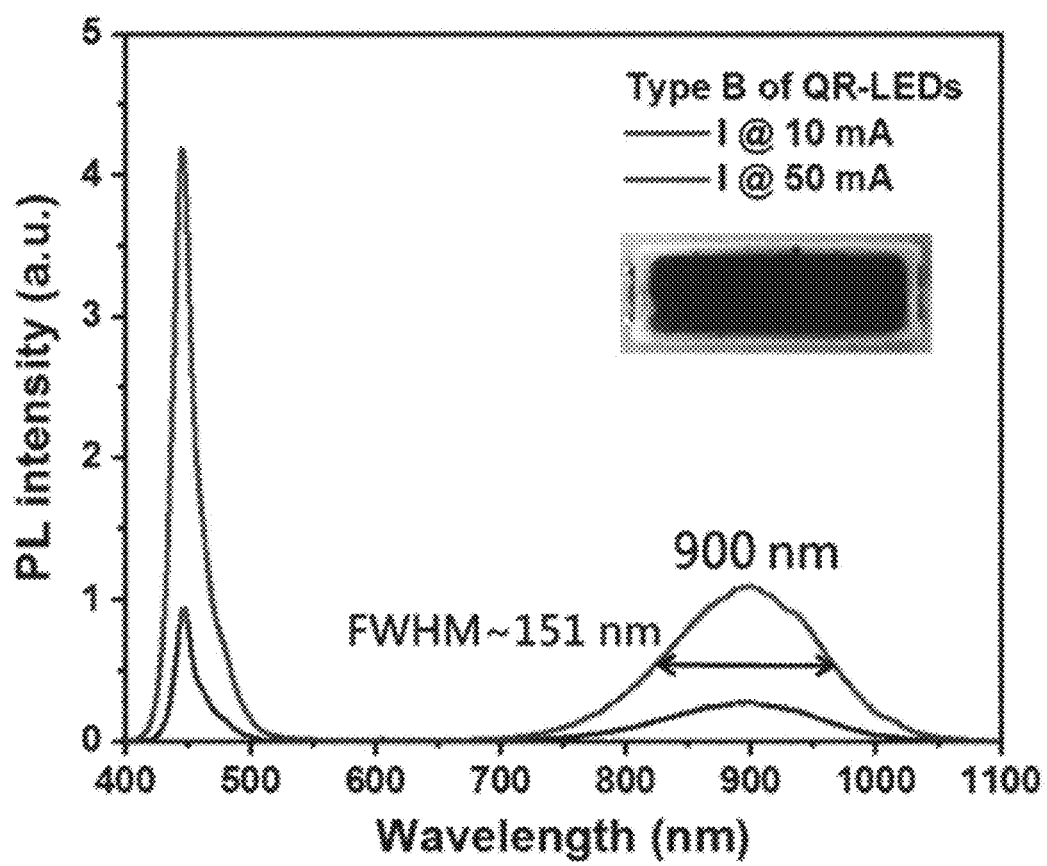
Figure 16:
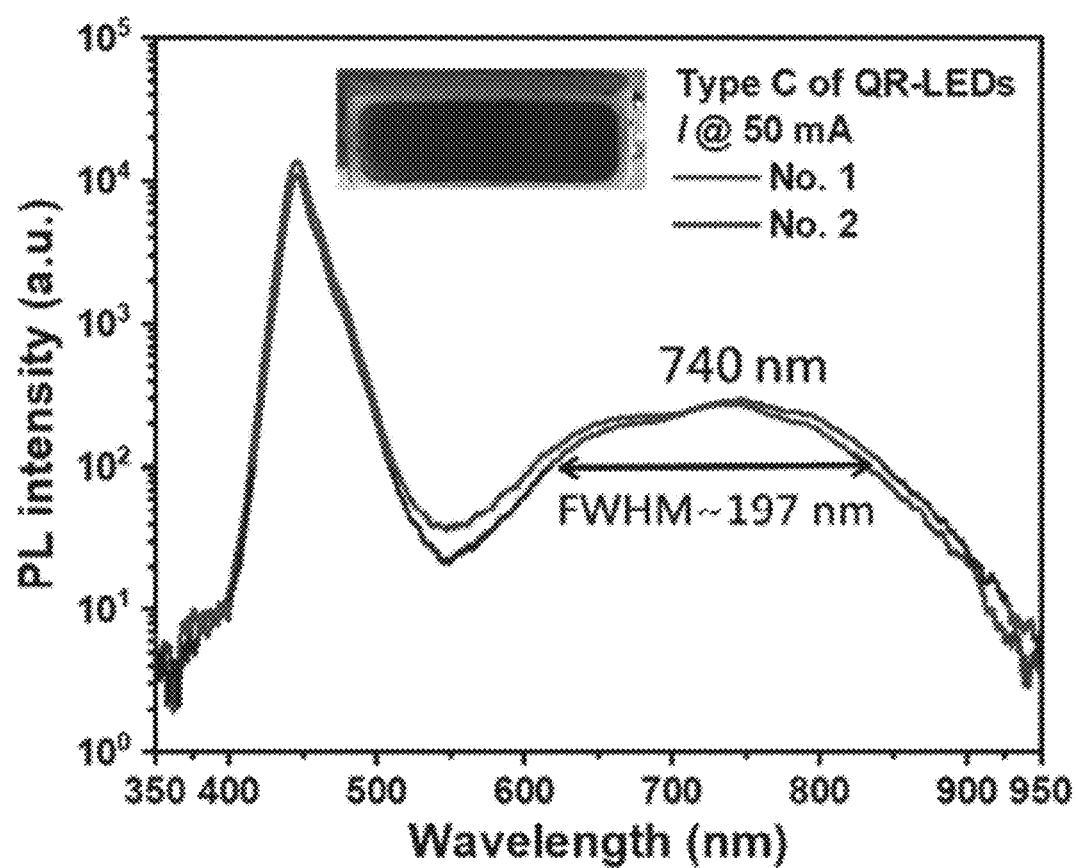
Figure 17:
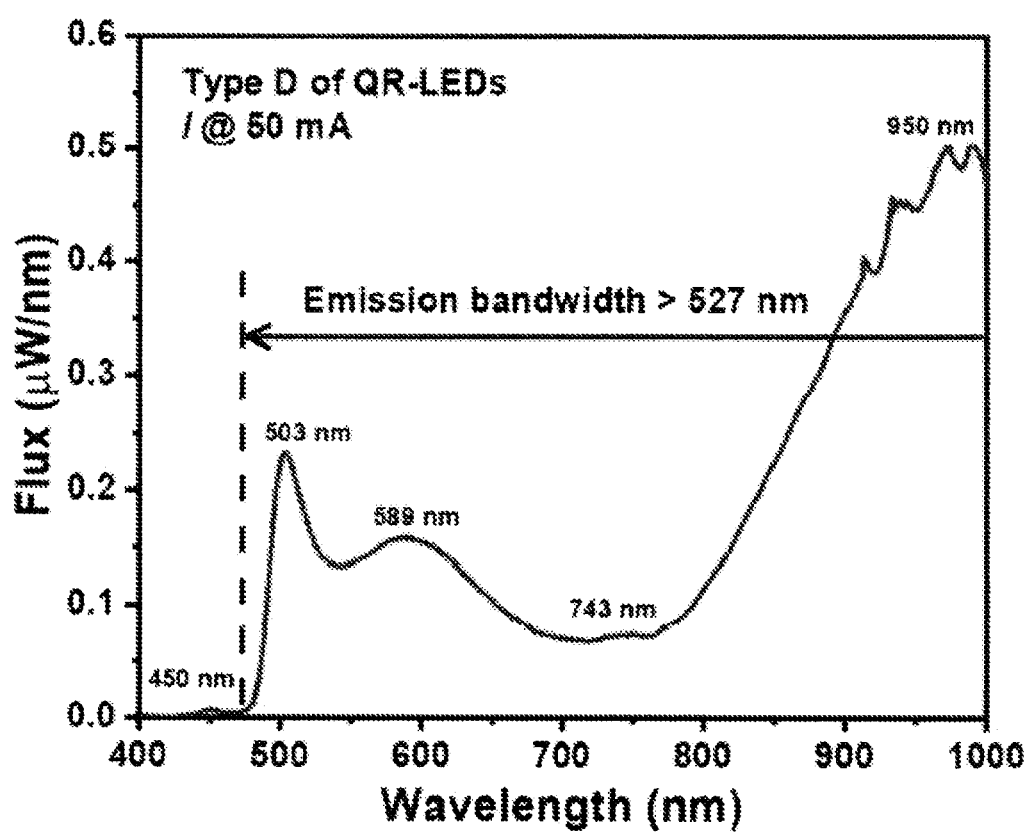

As shown in FIG. 10, the luminescent material has a laser spectrum in the wavelength range of 400-500 nm showing the efficacy of the ultra-broadband luminescence of the present invention, With reference to FIG. 12 and FIG. 13, spectroscopy images of the luminescent material in the second embodiment are presented. The images show that the luminescent material of the present invention has two excitonic emission bands. The first excitonic emission band is at a wavelength of 817 nm and the second excitonic emission band s at a wavelength of 465 nm. The present invention further excites the luminescent material by using 450 nm and 785 nm two different light sources with the results showing in FIG. 12 and FIG. 13. Especially for FIG. 13, the luminescent material was excited by a blue laser with 780 nm wavelength coming with the result of 1047 nm emission and FWHM closed to 204 nm which could considering ultra-broadband material from 800 nm to 1500 nm.

With reference to FIG. 14 to FIG. 17 and below table 1, several spectroscopy images of types A to D semiconductor package structure) of the second preferred application and results of Sphere Measurement System are presented. The samples are produced as 4014 PLCC type of semiconductor package structure with size of 0.9 mm*0.6 mm tested with 0.2@mA blue LED chip. As shown in such results, the present invention is proved to have high efficiency of NIR output ability. Especially to the Type D semiconductor package structure in Table 1, it can even match white light LED lighting requirement which could consider an ultra-broadband material.

TABLE 1 results of Sphere Measurement System.

| Sample | Applied Current (mA) | NIR$_{output}$ (mW) | $\eta_{PE}$ (%) | |
|---|---|---|---|---|
| Type A | 50 | 14.5 | 9.7 | |
| Type B | 50 | 10.4 | 6.9 | |
| Type C | 50 | 2.25 | 1.5 | |
| Type D | 50 | 10.5 | CCT (K) 3929 | Ra 84.42 |

Figure 18:
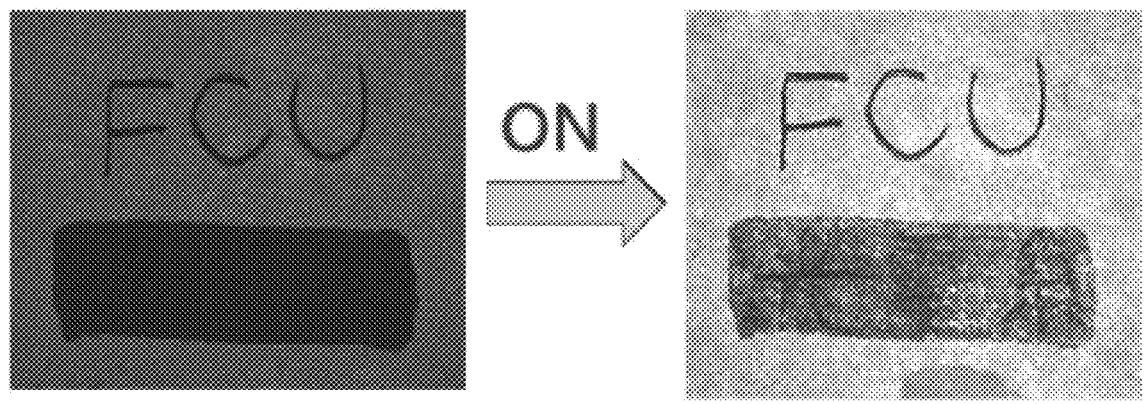
FIG. 18 to FIG. 20 are on and off images of ultramarine blue dye and human finger by exposing to type A semiconductor package structure of the second preferred application in accordance with the present invention.
Figure 19:
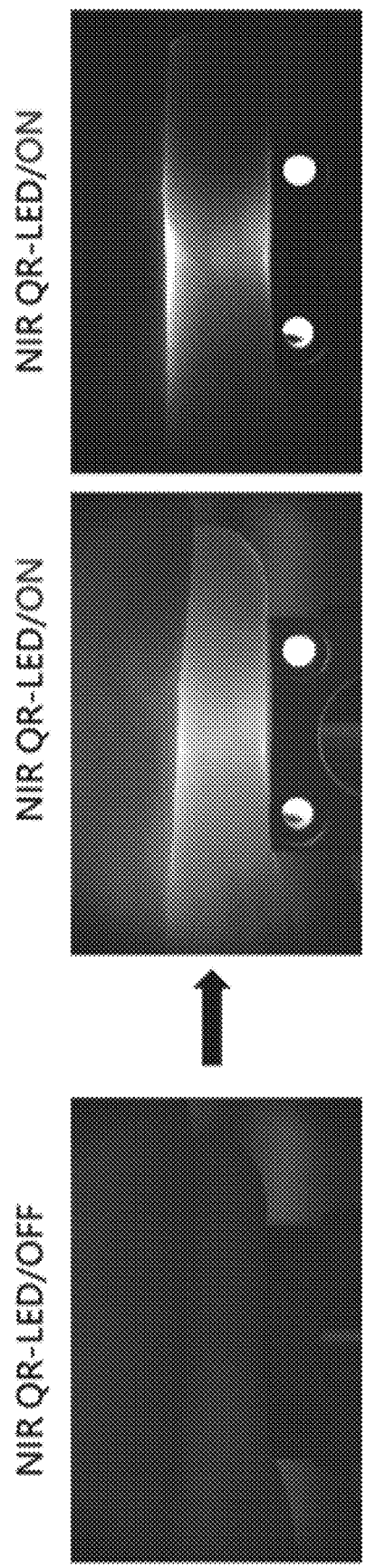
Figure 20:
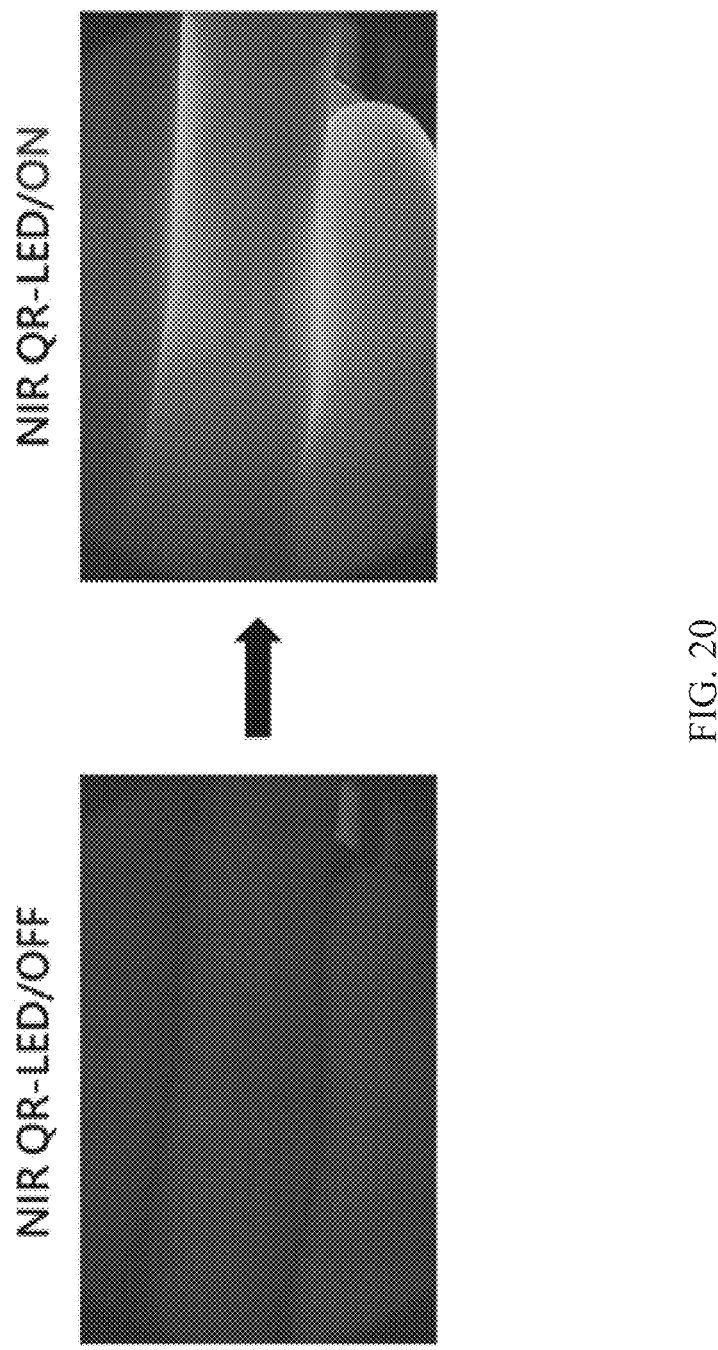

With reference to FIG. 18 to FIG. 20, on and off images of ultramarine blue dye and human finger by exposing to type A semiconductor package structure of the second preferred application of the present invention are presented. As shown by these images, it is clearly seen that the present invention has NIR output ability.

The present invention also tests and measures a polarization ratio (or also called. P/S ratio=$I_{max}/I_{min}$) of the polarizer from aforementioned preferred application embodiment. The result shows promising 5.5 of the P/S ration indicating 85% of the polarized light emitting from such embodiment.

The above specification, examples, and data provide a complete description of the present disclosure and use of exemplary embodiments. Although various embodiments of the present disclosure have been described above with a certain degree of particularity, or with reference to one or more individual embodiments, those with ordinary skill in the art could make numerous alterations or modifications to the disclosed embodiments without departing from the spirit or scope of this disclosure.

What is claimed is:

1. A luminescent material comprising:
a spherical core;
a first spherical shell deposited at an outer surface of the spherical core;
a second rod-shaped shell deposited at an outer surface of the first spherical shell; and
a third rod-shaped shell of zinc sulfide (ZnS) deposited at an outer surface of the second rod-shaped shell;
wherein:
the spherical core is an indium phosphide particle presenting as a spherical structure;
the first spherical shell is cadmium selenide (CdSe) deposited or coated onto the outer surface of the spherical core; and
the second rod-shaped shell is cadmium sulfide (CdS) deposited or coated onto the outer surface of the spherical shell.

2. The luminescent material as claimed in claim 1, wherein:
a fourth rod-shaped shell is further deposited or coated onto a surface of the third rod-shaped shell; and
the fourth rod-shaped shell is silicon dioxide (SiO$_2$), silicon monoxide or combination thereof.

3. The luminescent material as claimed in claim 1, wherein: an average aspect ratio of the second rod-shaped shell by its length and width is at a range of 2~11.

4. The luminescent material as claimed in claim 2, wherein: an average aspect ratio of the fourth rod-shaped shell by its length and width is at a range of 2~11.

5. The luminescent material as claimed in claim 3, wherein: a length of the second rod-shaped shell is less than 50 nm and a width of the second rod-shaped shell is greater than 4 nm.

6. The luminescent material as claimed in claim 4, wherein: a length of the fourth rod-shaped shell is less than 50 nm and a width of the fourth rod-shaped shell is greater than 4 nm.

7. A polarizer comprising the luminescent material as claimed in claim 1, wherein: the luminescent material is aligned in order.

8. The polarizer as claimed in claim 7, wherein a polarization ratio (P/S ratio) of the luminescent material is 5.5.

9. A semiconductor package comprising the luminescent material as claimed in claim 1, wherein: the luminescent material is blended with a polymer and packed into the semiconductor package with a chip.

10. The semiconductor package as claimed in claim 9, wherein the luminescent material is disturbed in order or alignment in the polymer as a membrane or a film and packed into the semiconductor package with a chip.

* * * * *